(12) United States Patent
Papasouliotis (10) Patent No.: US 7,288,463 B1
(45) Date of Patent: Oct. 30, 2007

(54) PULSED DEPOSITION LAYER GAP FILL WITH EXPANSION MATERIAL

(75) Inventor: George D. Papasouliotis, Peabody, MA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/414,459

(22) Filed: Apr. 28, 2006

(51) Int. Cl.
*H01L 21/762* (2006.01)

(52) U.S. Cl. ............... 438/431; 438/758; 438/788; 438/432; 257/E21.631

(58) Field of Classification Search ........... 438/758, 438/788, 431, 432
See application file for complete search history.

(56) References Cited

U.S. PATENT DOCUMENTS

| | | | |
|---|---|---|---|
| 5,314,724 A | 5/1994 | Tsukune et al. | |
| 5,525,550 A | 6/1996 | Kato | |
| 5,527,561 A | 6/1996 | Dobson | |
| 5,597,395 A | 1/1997 | Bocko et al. | |
| 5,705,028 A | 1/1998 | Matsumoto | |
| 5,985,770 A | 11/1999 | Sandhu et al. | |
| 6,030,881 A | 2/2000 | Papasouliotis et al. | |
| 6,064,104 A * | 5/2000 | Omid-Zohoor et al. | 257/510 |
| 6,102,993 A | 8/2000 | Bhandari et al. | |
| 6,133,160 A | 10/2000 | Komiyama et al. | |
| 6,184,108 B1 * | 2/2001 | Omid-Zohoor et al. | 438/431 |
| 6,184,143 B1 | 2/2001 | Ohashi et al. | |
| 6,300,219 B1 | 10/2001 | Doan et al. | |
| 6,335,261 B1 | 1/2002 | Natzle et al. | |
| 6,352,953 B1 | 3/2002 | Seki et al. | |
| 6,372,669 B2 | 4/2002 | Sandhu et al. | |
| 6,503,330 B1 | 1/2003 | Sneh et al. | |
| 6,504,233 B1 * | 1/2003 | Gorczyca et al. | 257/629 |
| 6,511,539 B1 | 1/2003 | Raaijmakers | |
| 6,531,377 B2 | 3/2003 | Knorr et al. | |
| 6,540,838 B2 | 4/2003 | Sneh et al. | |
| 6,551,339 B2 | 4/2003 | Gavronsky | |
| 6,551,399 B1 | 4/2003 | Sneh et al. | |
| 6,624,091 B2 | 9/2003 | Yuan | |
| 6,780,789 B1 | 8/2004 | Yu et al. | |
| 6,784,101 B1 | 8/2004 | Yu et al. | |
| 6,802,944 B2 | 10/2004 | Ahmad et al. | |

(Continued)

FOREIGN PATENT DOCUMENTS

WO    WO02/27063    4/2002

(Continued)

OTHER PUBLICATIONS

"Atomic Layer Deposition of Metal Oxide Thin Films," A thesis presented by Dennis Michael Hausmann, Harvard University, 186 pages, Jul. 2002.

(Continued)

*Primary Examiner*—Asok K. Sarkar
*Assistant Examiner*—Victor V. Yevsikov
(74) *Attorney, Agent, or Firm*—Beaver Weaver LLP (57) ABSTRACT

Conformal dielectric deposition processes supplemented with a deposited expansion material can fill high aspect ratio narrow width gaps with significantly reduced incidence of voids or weak spots. The technique can also be used generally to form composites, such as for the densification of any substrate having open spaces or gaps to be filled without the incidence of voids or seams.

23 Claims, 8 Drawing Sheets

U.S. PATENT DOCUMENTS

| | | | |
|---|---|---|---|
| 6,867,152 | B1 | 3/2005 | Hausmann et al. |
| 6,903,005 | B1 | 6/2005 | Marsh |
| 6,908,862 | B2 | 6/2005 | Li et al. |
| 6,949,481 | B1 | 9/2005 | Halliyal et al. |
| 6,984,591 | B1 | 1/2006 | Buchanan et al. |
| 7,097,878 | B1 | 8/2006 | Rulkens et al. |
| 7,129,189 | B1 | 10/2006 | Hausmann et al. |
| 7,148,155 | B1 | 12/2006 | Tarafdar et al. |
| 7,163,899 | B1 * | 1/2007 | Cho et al. .................. 438/758 |
| 7,202,185 | B1 | 4/2007 | Hausmann et al. |
| 7,223,707 | B1 | 5/2007 | Papasouliotis et al. |
| 2001/0049205 | A1 | 12/2001 | Sandhu et al. |
| 2003/0015764 | A1 | 1/2003 | Raaijmakers et al. |
| 2003/0092241 | A1 | 5/2003 | Doan et al. |
| 2003/0129828 | A1 | 7/2003 | Cohen et al. |
| 2003/0134741 | A1 | 7/2003 | Weisbeck et al. |
| 2003/0157781 | A1 | 8/2003 | Macneil et al. |
| 2004/0025787 | A1 | 2/2004 | Selbrede et al. |
| 2004/0043149 | A1 | 3/2004 | Gordon et al. |
| 2004/0043569 | A1 | 3/2004 | Ahn et al. |
| 2004/0079728 | A1 | 4/2004 | Mungekar et al. |
| 2004/0222490 | A1 * | 11/2004 | Raaijmakers et al. ....... 257/510 |
| 2004/0247787 | A1 | 12/2004 | Mackie et al. |
| 2005/0054213 | A1 | 3/2005 | Derderian et al. |
| 2005/0112282 | A1 | 5/2005 | Gordon et al. |
| 2005/0239264 | A1 | 10/2005 | Jin et al. |
| 2005/0271813 | A1 | 12/2005 | Kher et al. |
| 2006/0087000 | A1 * | 4/2006 | Okuno ....................... 257/506 |
| 2006/0127578 | A1 | 6/2006 | Li et al. |

FOREIGN PATENT DOCUMENTS

| | | |
|---|---|---|
| WO | WO 03/083167 A1 | 10/2003 |

OTHER PUBLICATIONS

Hausmann et al., "Rapid Vapor Deposition of Highly Conformal Silica Nanolaminates," Science, vol. 308, Oct. 2002, 5 Pages.

Gordon et al., "A Kinetic Model for Step Coverage by Atomic Layer Deposition in Narrow Holes or Trenches", Chemical Vapor Deposition 2003, 9, No. 2, pp. 73-78.

Gaillard et al., "Silicon dioxide chemical vapor deposition using silane and hydrogen peroxide", Rapid Communications, J. Vac. Sci. Technol. B 14(4), Jul./Aug. 1996, pp. 2767-2769.

Beekmann, et al., "Properties of posttreated low κ flowfill™ films and their stability after etch, resist and polymer strip processes", Microelectronic Engineering 55(2001), pp. 73-79.

Robl et al., "Integration of Flowfill® and Forcefill® for cost effective via applications" Sep. 1999, pp. 77-83.

Penka et al., "Integration Aspects of Flowfill and Spin-on-Glass Process for Sub-0.35μm Interconnects", pp. 1-3.

Hockele et al., "Flowfill-Process as a New Concept for Inter-Metal-Dielectrics", Siemens AG, Semiconductor Group, 1998, pp. 235-238.

Roland et al., "Theoretical Modeling of $SiO_2$ Photochemical Vapor Deposition and Comparison to Experimental Results for Three Oxidant Chemistries: $SiH_4+O_2$, $H_2O/O_2$, and $H_2O_2$", Chem Mater 2001, 13, 2501-2510.

Roland et al., "Low Temperature Photochemical Vapor Deposition of SiO2 Using 172 nm Xe2* Excimer Lamp Radiation with Three Oxidant Chemistries: $O_2$, $H_2O/O_2$, and $H_2O_2$", Chem Mater 2001, 13, 2493-2500.

Moore et al., "Reaction of hydrogen peroxide with organosilanes under chemical vapour deposition conditions", J. Chem. Soc., Dalton Trans., 2000, 2673-2677.

Gaillard et al., "Effect of plasma and thermal annealing on chemical vapor deposition dielectrics grown using $SIH_4$-$H_2O_2$ gas mixtures", J. Vac. Sci. Technol. A 15(5), Sep./Oct. 1997, pp. 2478-2484.

Taylor et al., "Studies on the reaction between silane and hydrogen peroxide vapour; surface formation of planarized silica layers", J. Chem. Soc., Dalton Trans., 1997, pp. 1049-1053.

Xia et al., "High Aspect Ratio Trench Filling Using Two-Step Subatmospheric Chemical Vapor Deposited Borophosphosilicated Glass for <0.18 μm Device Application", Journal of The Electrochemical Society, 146 (5) 1884-1888 (1999).

Xia et al., "High Temperature Subatmospheric Chemical Vapor Deposited Undoped Silicated Glass—A Solution for Next Generation Shallow Trench Isolation", Journal of The Electrochemical Society, 146 (3) 1181-1185 (1999).

Arno et al., "Fourier Transform Infrared Characterization of Downstream Gas-Phase Species Generated by Tetraethylorthosilicate/Ozone Atmospheric Pressure Reactions", Journal of The Electrochemical Society, 146 (1) 276-280 (1999).

Romet et al., "Modeling of Silicon Dioxide Chemical Vapor Deposition from Tetraethoxysilane and Ozone", Journal of The Electrochemical Society, 148 (2) G82-G90 (2001).

Ikeda et al., "The Effects of Alkoxy Functional Groups on Atomospheric-Pressure Chemical Vapor Deposition Using Alkoxysilane and Ozone", J. Electrochem. Soc., vol. 142, No. 5, May 1995, pp. 1659-1662.

"Customer A low κ Gapfill Trikon FlowFill vs FHDP", Novellus Systems, Inc., pp. 1-12.

Papsouliotis et al., "Method for Controlling Properties of Conformal Silica Nanolaminates Formed by Rapid Vapor Deposition", Novellus Systems, Inc., filed Jun. 22, 2004, U.S. Appl. No. 10/874,696, pp. 1-30.

Ritala et al., "Atomic Layer Deposition", Handbook of Thin Films Materials, vol. 1, 2002, pp. 103-159.

Rulkens et al., "Methods for the Use of Alkoxysilanol Precursors for Vapor Deposition of $SiO_2$ Films", Novellus Systems, Inc., filed Dec. 23, 2004, U.S. Appl. No. 11/021,558, pp. 1-24.

Papasouliotis et al., "Multi-Step Nanolaminate Dielectric Deposition and Etch Back Gap Fill Process", Novellus Systems, Inc., filed Dec. 30, 2004, U.S. Appl. No. 11/026,563, pp. 1-28.

Papasouliotis et al., "Methods for Forming High Density, Conformal, Silica Nanolaminate Films Via Pulsed Deposition Layer In Structures of Confined Geometry", Novellus Systems, Inc., filed Dec. 30, 2004, U.S. Appl. No. 11/026,284, pp. 1-24.

Cho et al., "Hydroxyl Bond Removal and Film Densification Method for Oxide Films Using Microwave Post Treatment", Novellus Systems, Inc., U.S. Appl. No. 11/280,076, filed Nov. 15, 2005, pp. 1-27.

U.S. Office Action mailed Nov. 10, 2005, from U.S. Appl. No. 11/021,558.

U.S. Office Action mailed Dec. 30, 2005, from U.S. Appl. No. 11/026,284.

U.S. Office Action mailed Dec. 22, 2005, from U.S. Appl. No. 11/026,563.

Papasouliotis et al., "Metal-Free Catalysts for Pulsed Deposition Layer Process for Conformal Silica Laminates", Novellus Systems, Inc., U.S. Appl. No. 11/318,268, filed Dec. 23, 2005, pp. 1-30.

Papasouliotis et al., "Reactive Seam Healing Methods for Improving Film Integrity In Structures of Confined Geometry", Novellus Systems, Inc., U.S. Appl. No. 11/334,762, filed Jan. 17, 2006, pp. 1-24.

U.S. Office Action mailed Apr. 25, 2006, from U.S. Appl. No. 11/021,558.

U.S. Office Action mailed May 24, 2006, from U.S. Appl. No. 11/026,284.

U.S. Office Action mailed May 31, 2006, from U.S. Appl. No. 11/026,563.

U.S. Office Action mailed May 15, 2006, from U.S. Appl. No. 11/027,480.

U.S. Office Action mailed Jul. 7, 2006, from U.S. Appl. No. 10/875,158.

U.S. Office Action mailed Sep. 27, 2006, from U.S. Appl. No. 11/021,558.

U.S. Office Action mailed Sep. 27, 2006, from U.S. Appl. No. 11/026,284.

U.S. Office Action mailed Sep. 29, 2006, from U.S. Appl. No. 11/027,480.

U.S. Office Action mailed Jan. 16, 2007, from U.S. Appl. No. 10/874,696.

U.S. Office Action mailed May 8, 2006, from U.S. Appl. No. 11/327,668.

U.S. Office Action mailed Apr. 13, 2007, from U.S. Appl. No. 11/026,284.

U.S. Office Action mailed Jul. 7, 2006, from U.S. Appl. No. 10/875,158.

U.S. Office Action mailed Mar. 23, 2007, from U.S. Appl. No. 11/021,558.

Papasouliotis et al., "Conformal Nanolaminate Dielectric Deposition and Etch Back Gap Fill Process and Apparatus," Novellus Systems, Inc., U.S. Appl. No. 11/524,502, filed Sep. 19, 2006, pp. 1-38.

Furumura, Y., et al., Selective Growth of Polysilicon, *J. Electrochem.Soc.: Solid-State Science and Technology*, Feb. 1986, pp. 379-383.

Harbeke, G., et al., Growth and Physical Properties of LPCVD Polycrystalline Silicon Films, *J. Electrochem.Soc.: Solid-State Science and Technology*, Mar. 1984, pp. 675-682.

Wolf and Tauber, *Silicon Processing For the VLSI Era—Chemical Vapor Deposition of Amorphous and Polycrystalline Films*, vol. 1, 1st Edition, Lattice Press, 1986, pp. 175-181.

Ritala, M., et al., Perfectly Conformal TiN and $Al_2O_3$ Films Deposited by Atomic Layer Deposition, *Chemical Vapor Deposition Communications*, 1999, 5, No. 1, pp. 7-9.

Xu, K., et al., Low temperature deposition and characterization of polycrystalline Si films on polymer substrates, 2001 American Vacuum Society, *J. Vac. Sci. Technol. A 19*(4), Jul./Aug. 2001, pp. 1078-1082.

Herner, S.B., et al., *Electrochemical and Solid-State Letters*, 7 5 G108-G111 2004, pp. 1-7.

U.S. patent application *Process for forming thick oxides on Si or SiC for semiconductor devices*, Chiola et al., U.S. Appl. No. 10/885,378, filed Jul. 6, 2004, 6 pages.

\* cited by examiner

PULSED DEPOSITION LAYER GAP FILL WITH EXPANSION MATERIAL

BACKGROUND OF THE INVENTION

This invention relates to dielectric gap fill, particularly in high aspect ratio, narrow width recessed features. More specifically, the invention relates to gap fill with a nanolaminate deposition processes enhanced with an expansion material.

It is often necessary in semiconductor processing to fill a high aspect ratio gap with insulating material, for example, for IMD/ILD, PMD, and STI gap fill with doped or undoped silica glass. As device dimensions shrink and thermal budgets are reduced, void-free filling of high aspect ratio spaces (e.g., AR>3:1) becomes increasingly difficult due to limitations of existing deposition processes. The method currently used for high aspect ratio (AR) gap-fill is deposition of doped or undoped silicon dioxide assisted by high density plasma chemical vapor deposition (HDP CVD), a directional (bottom-up) CVD process. Evolving semiconductor device designs and dramatically reduced feature sizes have resulted in several applications where HDP processes are challenged in filling the high aspect ratio structures (e.g., AR>7:1) using existing technology (see, for example, U.S. Pat. No. 6,030,881). For structures representative of the 65 nm and 45 nm technology nodes, engineering the gap fill process becomes structure dependent, requiring that the process be re-optimized, a task of considerable complexity, every time a new structure needs to be filled.

An alternative to CVD is atomic layer deposition (ALD). ALD methods involve self-limiting adsorption of reactant gases and can provide thin, conformal dielectric films within high aspect ratio features. The ALD process involves exposing a substrate to alternating doses of, usually two, reactant gasses. As an example, if reactants A and B are first and second reactant gases for an ALD process, after A is adsorbed onto the substrate surface to form a saturated layer, B is introduced and reacts only with adsorbed B. In this manner, a very thin and conformal film can be deposited. One drawback, however, to ALD is that the deposition rates are very low. Films produced by ALD are also very thin (i.e., about one monolayer); therefore, numerous ALD cycles must be repeated to adequately fill a gap feature. These processes are unacceptably slow in some applications in the manufacturing environment.

Another more recently developed technique useful in gap fill and other dielectric deposition applications in semiconductor processing is referred to as pulsed deposition layer (PDL) processing, sometimes also referred to as rapid surface-catalyzed vapor deposition (RVD). PDL is similar to ALD in that reactant gases are introduced alternately over the substrate surface, but in PLD the first reactant A acts as a catalyst, promoting the conversion of the second reactant B to a film. In ALD the reaction between A and B is approximately stoichiometric, meaning that a monolayer of A can only react with a similar amount of B before the film-forming reaction is complete. The catalytic nature of A in PDL allows a larger amount of B to be added, resulting in a thicker film. Thus, PDL methods allow for rapid film growth similar to using CVD methods but with the film conformality of ALD methods.

Deposited oxide films often require densification in order for their properties to match those of thermally generated silicon oxide (USG), which will allow its successful integration into functioning devices. Densification removes water from the deposited film. Moreover, the conformal nature of the process results in the formation of seams in filled trenches, which may allow attack by post gap fill wet etch (HF-based) in the seam. Etching in the seam can allow for polysilicon deposition in the seam during subsequent processing which would obviate its insulating effect. Therefore, a process sequence to anneal the film and substantially eliminate seams and voids is required. Due to the conformal nature of the process, areas of low material density (seams) form where the advancing fronts meet in the trenches. When the film is exposed to the acidic etching solution during subsequent wet process steps, the seams in the dielectric layer expand and can become voids, ultimately causing device failure. Therefore, a process sequence to prevent seams and void formation in the PDL oxide, or other conformal films is required. Previously, minimizing the film roughness or operating at high pressure conditions have been proposed as potential approaches for preventing seam formation. However, alternative approaches would be valuable to expand the options available for improving gap fill performance.

SUMMARY OF THE INVENTION

The present invention addresses this need by providing conformal dielectric deposition (e.g., pulsed deposition layer (PDL) processing or ALD) processes supplemented with a deposited expansion material that can fill high aspect ratio (at least 3:1, typically at least 5:1, for example 7:1 or greater), narrow width (typically sub 0.13 micron, for example 0.1 micron or less) gaps with significantly reduced incidence of voids or weak spots. The invention relates to a deposition technique for improving the gap-fill performance of doped or un-doped silica glass in IMD/ILD, PMD, and STI gap fill applications. Both conformal (PDL or ALD) and line of sight deposition processes result in the formation of seams and voids when vertical or reentrant features are present in a structure. Completing the deposition process with a material, which upon further treatment can expand and form dielectric to occupy the extra volume, can eliminate these seams and voids. One system for application of the method is Si/SiO$_2$. The specific volume of SiO$_2$ is double that of Si. Thus, the invention accomplishes seamless and void free more robust gap fill in high aspect ratio gaps encountered in advanced technology nodes. It can be also used to eliminate seams and voids resulting from reentrant trench profiles.

In semiconductor gap fill applications, the initial deposition part of the process involves the use of any suitable conformal dielectric deposition process, in particular a PDL or ALD process. For example, a suitable PDL-based process involves exposing the gap containing substrate surface to a metal-containing or metal-free precursor gas to form a saturated layer of a catalyst on the substrate surface, and then exposing the substrate surface to a silicon-containing precursor gas to form a dielectric film layer. This initial part of the process may optionally be repeated until the gap is less than 100 Å wide, for example about 70-40 Å wide, e.g., about 50 Å wide. This initial deposition is then supplemented by deposition of a second material that has the capacity to expand when treated following deposition. For example, Si in the form of polysilicon can be deposited to fill the remaining portion of the gap. Oxidation of the polysilicon following its deposition converts it to SiO$_2$ causing it to expand to as much as twice its as deposited volume. The expansion causes the material to occupy any volume in the gap that would otherwise be a seam or void.

More generally, the technique of the invention can be used to form composites, such as for the densification of any substrate comprising open spaces or gaps to be filled without the incidence of voids or seams.

In another implementation of the invention, a method of forming a composite structure is provided. According to the method, a substrate is provided in a deposition reaction chamber; a second material having the capacity to expand and form dielectric when treated following deposition is deposited on the substrate surface; and the second material is treated following its deposition to cause it to expand. The substrate may be flat, porous or fibrous, for example; the second material may be a metal or metalloid; and the treatment may be an oxidation.

These and other features and advantages of the present invention are described below where reference to the drawings is made.

DETAILED DESCRIPTION OF THE INVENTION

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

The formation of a seam in gap fill using conformal dielectric deposition is caused by the onset of diffusion limitations. Precursor material is prevented from reaching the bottom of the high aspect ratio trenches, which form at the latter stages of the trench fill process. The results are consistent with reports in the literature (see, for example, M. Ritala, et. al., Chem. Vap. Deposition, 5(1), 7 (1999)). Seams form because as the trench lateral dimension shrinks (with increasing fill by PDL, for example, oxide), reactants require longer times to diffuse to the bottom of the trench and react there.

Figure 1:
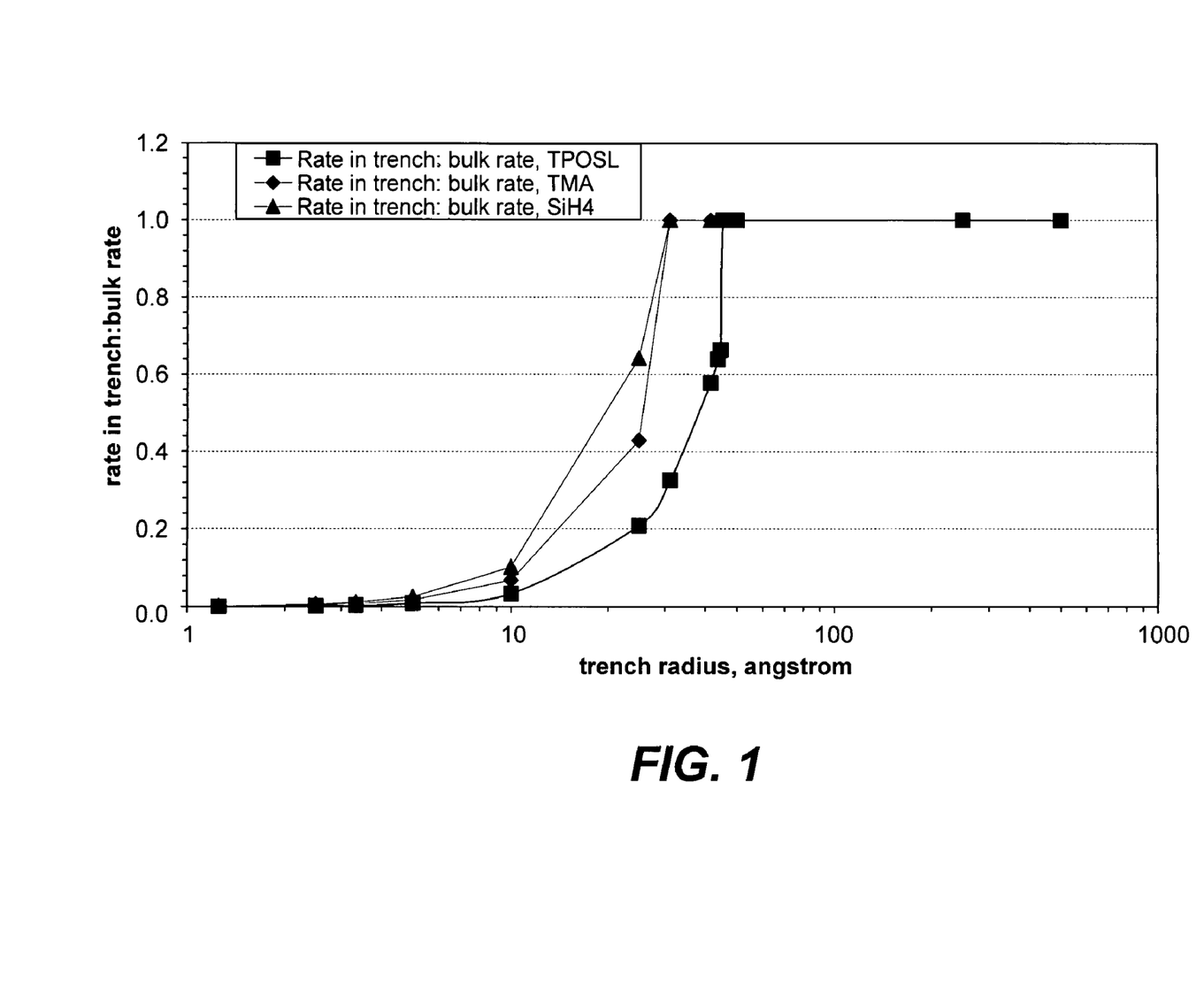
FIG. 1 shows the effect of increasing diffusion limitations on the rate of chemical reaction occurring in a rectangular trench of decreasing width.

FIG. 1 shows the effect of increasing diffusion limitations on the rate of chemical reaction occurring in a rectangular trench of decreasing width. The ratio of reaction rate at the bottom of the trench to the reaction rate at the top of the trench is plotted as a function of trench dimension. For the case of tris(t-pentoxy) silanol (TPOSL) (MW=306), the two rates are constant until the trench radius reaches about 40 Å. This is why PDL and ALD processes deposit conformal barrier films. After the 40 Å mark, however, the ratio decreases, which means that the rate of reaction at the top of the trench is increasingly faster relative to that at the bottom. Therefore, a seam or void is formed.

The present invention relates to conformal dielectric (e.g., silica nanolaminate) deposition (e.g., pulsed deposition layer (PDL) processing or atomic layer deposition (ALD)) processes supplemented with a deposited expansion material that can fill high aspect ratio (at least 3:1, typically at least 5:1, for example 7:1 or greater), narrow width (typically sub 0.13 micron, for example 0.1 micron or less) gaps with significantly reduced incidence of voids or weak spots. The invention relates to a deposition technique for improving the gap-fill performance of doped or un-doped silica glass in IMD/ILD, PMD, and STI gap fill applications. Both conformal (PDL or ALD) and line of sight deposition processes result in the formation of seams and voids when vertical or reentrant features are present in a structure. Completing the deposition process with a material, which upon further treatment can expand and form dielectric to occupy the extra volume, can eliminate seams and voids. One system for application of the method is $Si/SiO_2$. The specific volume of $SiO_2$ is double that of Si. Thus, the invention accomplishes seamless and void free more robust gap fill in high aspect ratio gaps encountered in advanced technology nodes. It can be also used to eliminate seams and voids resulting from reentrant trench profiles.

The initial deposition part of the process involves the use of any suitable nanolaminate dielectric deposition process, in particular a PDL or ALD process. For example, a suitable PDL-based process involves exposing the gap containing substrate surface to a metal-containing or metal-free precursor gas to form a saturated layer of a catalyst on the substrate surface, and then exposing the substrate surface to a silicon-containing precursor gas to form a dielectric film layer. This initial part of the process may optionally be repeated. Either way, the gap is generally filled with deposited dielectric until the diffusion limitation of the partially filled gap for the relevant dielectric precursor is approached or reached. For example, until the gap is less than 100 Å wide, for example about 70-10 Å wide, e.g., about 50 Å wide. In some implementations of the invention, the initial dielectric deposition may be stopped before this point, i.e., while the partially filled gap is still wide enough that diffusion limitations are easily avoided. But it is preferred in many implementations to maximize the thickness of the initial dielectric deposition.

This initial deposition is then supplemented by deposition of a second material that has the capacity to expand and form dielectric when treated following deposition. For example, Si in the form of polysilicon can be deposited to fill the remaining portion of the partially filled gap. Oxidation of the polysilicon following its deposition converts it to $SiO_2$ causing it to expand to as much as twice its as deposited volume. The expansion causes the material to occupy any volume in the gap that would otherwise be a seam or void. The resulting gap fill dielectric can be a single phase oxide material, e.g., $SiO_2$.

General Process Parameters
Initial Deposition

The initial dielectric deposition may be by any suitable conformal process, for example ALD or PDL. The dielectric may be any suitable silicon oxide-based material, doped or undoped, for example undoped silicon dioxide (undoped silica glass (USG)). In general, a layer thickness of about 150-15,000 Å or 300-1500 Å, for example about 500 Å is suitable.

Initial dielectric deposition by PDL is preferred. The formation of silica films by a pulsed layer deposition (PDL) can be catalyzed by metal containing or metal and metalloid-free compounds, such as acidic compounds. Specific examples are aluminum-containing catalyst precursors, for example, trimethylaluminum ($Al(CH_3)_3$), or phosphoric acid ($H_3PO_4$).

A pulsed layer deposition (PDL) process to form a conformal dielectric film begins with placement of a substrate into a deposition chamber. For many embodiments of the invention, the substrate is a semiconductor wafer. A "semiconductor wafer" as discussed in this document is a semiconductor substrate at any of the various states of manufacture/fabrication in the production of integrated circuits. As mentioned previously, one commercially important application of the present invention is in various dielectric gap-fill applications, such as filling of STI or PMD features. A catalyst or a catalyst precursor is supplied into the deposition chamber so as to substantially saturate the substrate surface. Any compound or precursor that can sufficiently adsorb onto or react with the substrate surface and prepare it to sufficiently further react with the subsequently added silicon-containing precursor may be used. In addition, the catalyst or precursor should be capable of aiding the catalytic polymerization of the subsequently added silicon-containing precursor to produce a film thicker than a monolayer.

Metal-containing compounds suitable as catalyst precursors in a PDL process include aluminum-containing compounds, for example, hexakis(dimethylamino) aluminum ($Al_2(N(CH_3)_2)_6$) or trimethylaluminum ($Al(CH_3)_3$). Other suitable aluminum-containing precursors include, for example, triethylaluminum ($Al(CH_2CH_3)_3$) or aluminum trichloride ($AlCl_3$). Other metal-containing precursors that can be deposited to reactivate the catalytic surface include, but are not limited to, zirconium, hafnium, gallium, titanium, niobium, tantalum, and their oxides or nitrides.

Metal- and metalloid-free compounds suitable as catalysts in a PDL process include organic acids (e.g., acetic acid), anhydrides of organic acids, dialkylphosphates, alkysphosphates, phosphonic acids, phosphinic acids, phosphorus oxides, alkylamines (primary, secondary or tertiary), arylamines, alky/arylboronic acids, sulphonic acids, water, ammonium salts, phosphonitrile compounds, boron triflates, inorganic acids (e.g., phosphoric acid), anhydrides of inorganic acids, and combinations thereof.

Forming a catalyst-activated layer is a self-limiting process. Relevant process conditions can include substrate (e.g., wafer) temperature, reactor pressure, reactant partial pressure, and combinations thereof, and can very widely depending upon the particular catalyst or precursor used. For a metal containing catalyst precursor, pressures can range broadly, e.g., between about 1 mTorr and 760 Torr. Typical pressures range between about 100 and 750 mTorr and typical temperatures range between about 250 and 300 degrees Celsius. Flow rates of aluminum-containing precursor gas can range broadly, e.g., between about 1 and 10000 sccm. Preferred flow rates of aluminum-containing precursor gas range between about 100 and 400 sccm. The dose of aluminum-containing precursor can range broadly, e.g., between about 0.001 milligrams and 10 grams. Typical aluminum-containing precursor doses range between about 0.01 and 0.02 grams. Exposure times suitable for forming a saturated layer are typically only seconds. In some embodiments, for example, an exposure time of about 1 to 2 seconds is found to be sufficient.

For a metal- and metalloid-free catalyst, pressures can range broadly, e.g., between about 1 mTorr and 760 Torr. Typical pressures range between about 500 and 1250 mTorr and typical temperatures range between about 0 and 300° C., for example between about 20 and 250° C., such as 20, 50, 100, 200, 230 or 250° C. in various implementations. Flow rates of catalyst reactants can range broadly, e.g., between about 1 and 10000 sccm in the gas phase. Preferred gas phase flow rates of the catalyst range between about 1 and 100 sccm. Catalysts may also alternatively be delivered to the reactor and/or the substrate surface in the liquid phase. Suitable liquid phase delivery flow rates can be between 0.01 and 100 mL/min; or the liquid catalysts can be delivered to the substrate surface by dipping, painting, spraying, etc. Suitable liquid phase catalyst concentrations can vary widely, for example from about $10^{-3}$ to 12M, such as about 0.01, 0.1, 1, 2, 5, 7 or 10M. Exposure times suitable for forming a saturated layer are typically only seconds, e.g., about 1 to 10 seconds. In some embodiments, for example, an exposure time of about 2 seconds or 5 seconds is found to be sufficient. Given the directions and parameters provided herein, one of skill in the art will be able to readily determine the appropriate conditions for effective use of a given catalyst in accordance with the present invention.

After the catalyst layer is formed an inert gas is preferably used to purge the substrate surface and reaction chamber (not shown). It should be noted that introduction of a purge gas can be used in between operations wherein contact between reactant gases should be avoided, including between each process cycle. Further, the purge gas can be flowed continuously during any of these operations and a period or periods between the operations. Purge gases are generally inert. Examples include the noble gases (e.g., argon) and nitrogen. The reaction chamber may additionally be evacuated following inert gas purge.

Following the chamber purge, the catalyst-activated substrate surface is exposed to a silicon-containing precursor gas under conditions selected for growth of a conformal dielectric film. Any suitable silicon-containing precursor that can sufficiently adsorb onto and react with the catalytic layer to form a dielectric film may be used. In addition, the silicon-containing precursor should be capable of polymerization when exposed to the adsorbed catalyst to produce a film thicker than a monolayer. Preferred silicon-containing precursors include silanols and silanediols, such as alkoxysilanols, alkyl alkoxysilanols, alkyl alkoxysilanediols and alkoxysilanediols. Examples of suitable precursors include tris(tert-butoxy)silanol (($C_4H_9O)_3SiOH$), tris(tert-pentoxy)silanol(($C_5H_{11})_3SiOH$), di(tert-butoxy)silandiol (($C_4H_9O)_2Si(OH)_2$) and methyl di(tert-pentoxy)silanol.

Process parameters during exposure to the silicon-containing precursor including temperature, gas pressure, flow rate, dose and exposure times will vary depending on the types of precursors used, reaction chamber configuration and desired final film thickness, deposition rate and dielectric characteristics, among other variables. As noted, the process conditions in accordance with the present invention are dynamic, at first selected to optimize surface smoothness, then selected to optimize conformality and deposition rate. Generally, temperatures can range from about 150 to 300° C. A typical initial deposition temperature is about 200° C.; and 230° C. for subsequent deposition stages. Pressures can range broadly, e.g., between about 1 mTorr and 760 Torr. Typical pressures range between about 500 mTorr and 20 Torr. Flow rates of silicon-containing precursor gas can range broadly, e.g., between about 1 and 10000 sccm. Preferred flow rates of silicon-containing precursor gas range between about 200 and 1000 sccm. Exposure times can range broadly, e.g., between about 1 milliseconds and 200 seconds. Preferred exposure times typically range between about 10 and 60 seconds. The number of separate exposures to silicon-containing precursor will primarily depend upon the desired final film thickness. Typical numbers of silicon-containing precursor exposure cycles for a STI feature 0.1 micron in diameter range between about 2 and 4. Again, as with the temperature process condition, these other process conditions may be modulated alone or in combinations in the dynamic process of the invention in accordance with the parameters noted above.

While the invention is not limited to this theory of operation, as mentioned previously, it is believed that the catalyst is adsorbed onto or reacts with the substrate surface, and the accumulation of dielectric film is achieved via a polymerization process. The activated substrate surface layer can catalytically polymerize the silicon-containing precursor to produce growing chains of silica. After a period of growth determined by the substrate temperature, the silica polymer can "gel" or "crosslink" to form a solid silicon oxide.

The catalyst and silicon-containing precursor exposures may be repeated a number of times, for example a total of 2-5 times, to build up a silica nanolaminate structure forming the completed dielectric film. For example, the operations might be repeated until a gap is filled by the deposited dielectric to the diffusion limitations of the process. The operations of exposing the substrate to the catalyst and the silicon-containing precursor can be carried out in a single chamber, or in separate reactor chambers.

Either way, the gap is generally filled with deposited dielectric until the diffusion limitation of the partially filled gap for the relevant dielectric precursor is approached or reached. For example, until the gap is less than 100 Å wide, for example about 70-10 Å wide, e.g., about 50 Å wide. In some implementations of the invention, the initial dielectric deposition may be stopped before this point, i.e., while the partially filled gap is still wide enough that diffusion limitations are easily avoided. But it is preferred in many implementations to maximize the thickness of the initial dielectric deposition.

Gap Fill Processes Supplemented by Expansion Material

As noted above, the conformal nature of the deposition processes such as PDL and ALD can result in the formation of seams or voids at the center of the trench when the diffusion limits of the processes are reached. These seams and voids need to be avoided to ensure device performance. One valuable application of the present invention is in semiconductor wafer gap fill for high aspect ratio (A/R) trenches; that is A/R of 3:1 or more e.g., 7:1, 10:1, 12:1 or more. In accordance with the present invention, this is accomplished by supplementing the initial conformal dielectric deposition with a deposition of a second material that has the capacity to expand when treated following deposition.

Figure 2:
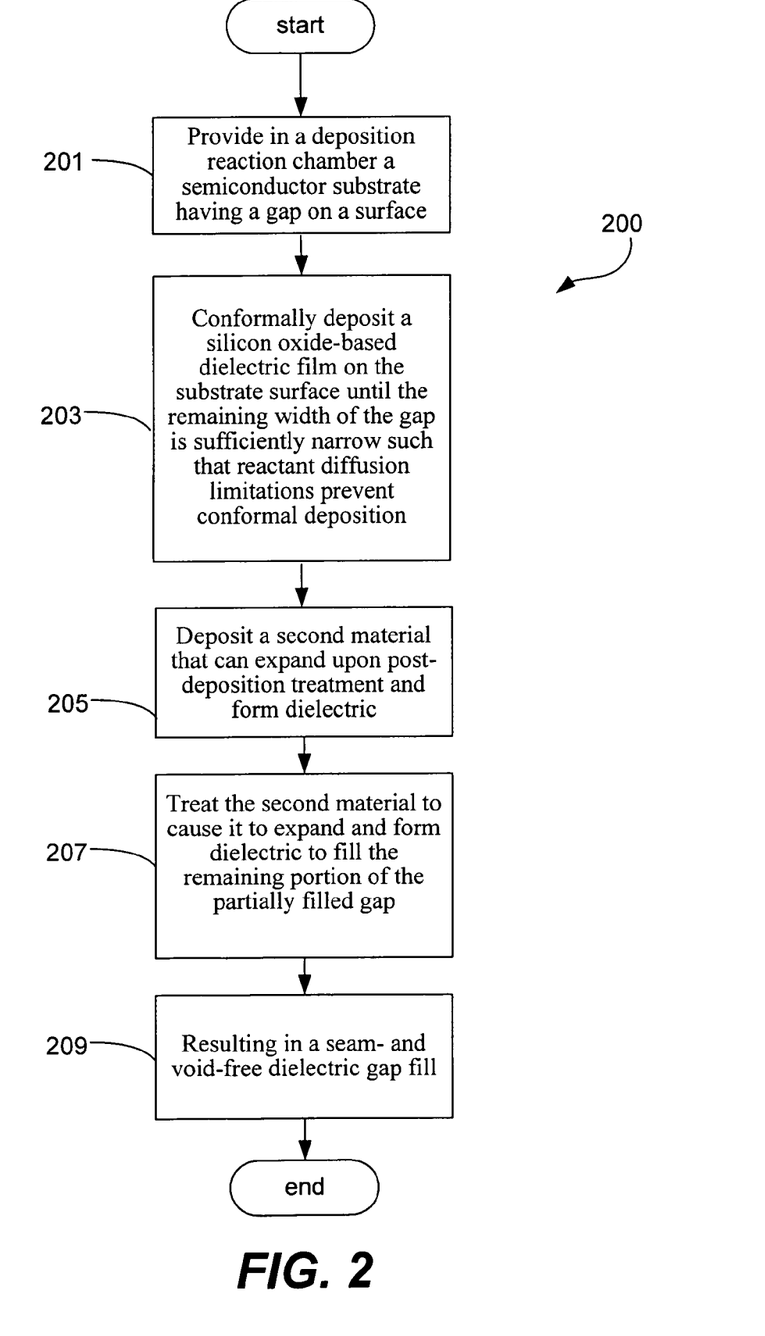
FIG. 2 is a process flow diagram depicting important operations in a gap fill process in accordance with the present invention.
Figure 3A:
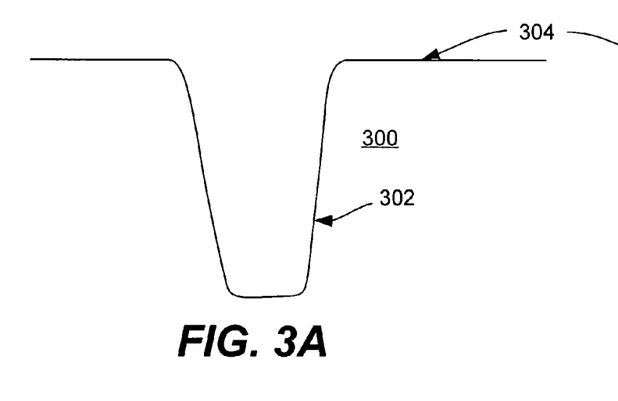
FIGS. 3A-D provide schematic cross-sectional illustrations showing important operations in a method of gap fill in accordance with the present invention.
Figure 3B:
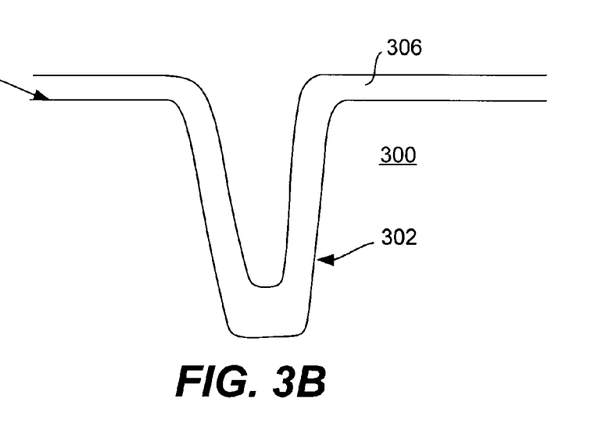
Figure 3C:
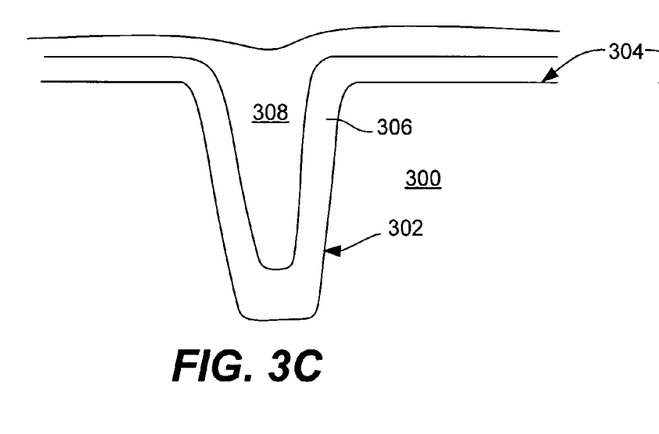
Figure 3D:
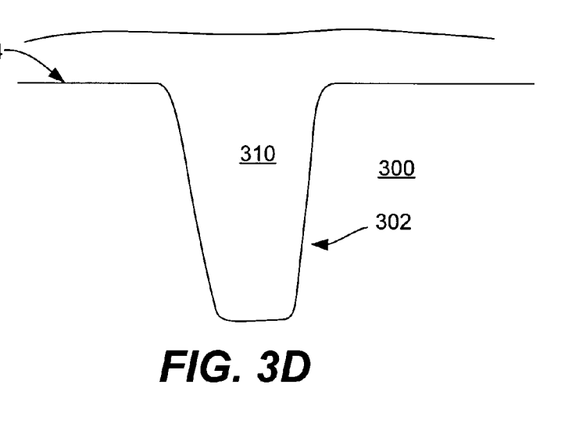

FIG. 2 illustrates a process flow and FIGS. 3A-D provide schematic cross-sectional illustrations showing important operations in a method of gap fill in accordance with the present invention. The method 200 involves providing in a deposition reaction chamber a semiconductor substrate 300 having a gap 302 on a surface 304 (201) and then conformally depositing, by a process such as PDL or ALD, a silicon oxide-based dielectric film 306 on the substrate surface until the gap is partially filled, in this example such that the remaining width of the gap is sufficiently narrow such that the point at which reactant diffusion limitations prevent conformal deposition is approached or reached (203). As noted above, in alternative implementations of the invention the initial dielectric deposition may be stopped before this point, i.e., while the partially filled gap is still wide enough that diffusion limitations are easily avoided. In the present case, the film is deposited until the gap width is less than 100 Å, or less than 50, 40 or even 10 Å, for example, depending upon the dielectric precursor. The general parameters of a PDL process suitable for accomplishing this have been described above.

Once the initial dielectric film deposition is complete, the formation of a void or seam can be prevented by deposition of a second material 308 that can expand upon post-deposition treatment and form dielectric to occupy the volume that would otherwise be void (205). The material 308 is then treated, for example by oxidation, to cause it to expand and form dielectric (e.g., oxide) to fill the remaining portion of the partially filled gap and occupy any volume in the gap that would otherwise be a seam or void (207). The expansion treatment may convert a material that is not a dielectric upon deposition into a dielectric, or the second material may be a dielectric upon deposition. The result is a seam- and void-free dielectric gap fill 310 (209).

For example, for the common case of deposited $SiO_2$ dielectric, Si in the form of polysilicon can be deposited to fill the remaining portion of a gap partially filled with conformal $SiO_2$. Polycrystalline Si can be deposited by thermal CVD at temperatures below 700° C. (see, e.g., Wolf and Tauber "Si Processing for the VLSI Era", vol. 1, p 175-, $1^{st}$ edition, Lattice Press, 1986), for example, and is capable of very high aspect ratio fill due to increased surface mobility. After deposition, the material can be treated in an oxidizing medium, for example, steam oxidation at or above about 700° C. for 1 hour, to create silicon oxide. The molecular volume of $SiO_2$ is roughly double that of Si (14 vs. 27.3 cm3/gmole), hence the expansion of the material will occupy the volume that would otherwise be void. The resulting gap fill dielectric can be a single phase oxide material, e.g., $SiO_2$.

More generally, any organosilicon that is liquid at the processing temp may be used, in particular for semiconductor implementations of the invention. Such a silicon-containing liquid precursor can be in situ oxidized to produce silicon oxide. Examples include TPOSL, tris(tert-butoxy) silanol, etc. The specific volume of oxides is larger than these of the corresponding metals and metalloids in all cases. In non-semiconductor applications, non-Si-based precursors that can expand with post-deposition treatment may also be used. Examples include composite material fabrication where a porous substrate is filled with a second material. In accordance with the invention, the fill material can be a metal or metalloid that can be deposited by CVD, ALD, or other methods (PVD) and then oxidized, or otherwise treated, to expand and thereby fill any vacant space in the porous material.

The post-deposition oxidation can be done by a thermal process using steam, $O_2$ or other suitable oxidants according to standard processes used in the art. Energy can be provided by heat (e.g., thermal CVD), RTP or other flash anneal (e.g., laser spike annealing such a described in co-pending application Ser. No. 11/327,668). In some implementations of the invention, nitridation can be used as an alternative to oxidation in order to expand a precursor material.

OTHER EMBODIMENTS

This method applies to the deposition of silica (USG) for gap fill. However, this method may also be used for depositing doped silica films, such as fluorine-doped silicate glass (FSG), phosphosilicate glass (PSG), boro-phospho-silicate glass (BPSG), or carbon doped low-k materials. It pertains to IMD/ILD, STI and PMD applications.

Even though the described embodiments of the invention emphasize applications pertaining to the fabrication of semiconductor devices, the scope of the invention is not limited to these applications. The approach can be used to form composites, such as for the densification of any substrate comprising open spaces or gaps to be filled without the incidence of voids or seams, for example, the fibrous preform of a composite, or open pore space of a template nanostructure. In addition, the invention is not strictly limited to gap fill applications, but may be used in the formation of a dielectric layer on any suitable substrate in semiconductor or other applications.

Apparatus

The process operations can be carried out in situ in the same chamber, in an integrated mode (tool), or in separate chambers (with or, preferably, without vacuum break). Some sample apparatus for implementing the invention are described below. While the apparatus described below relates to PDL, it should be understood that these are just examples of apparatus suitable for implementation of the present invention. Several other deposition and anneal techniques, and associated apparatus, examples of which are known in the art, may alternatively be used.

Figure 4:
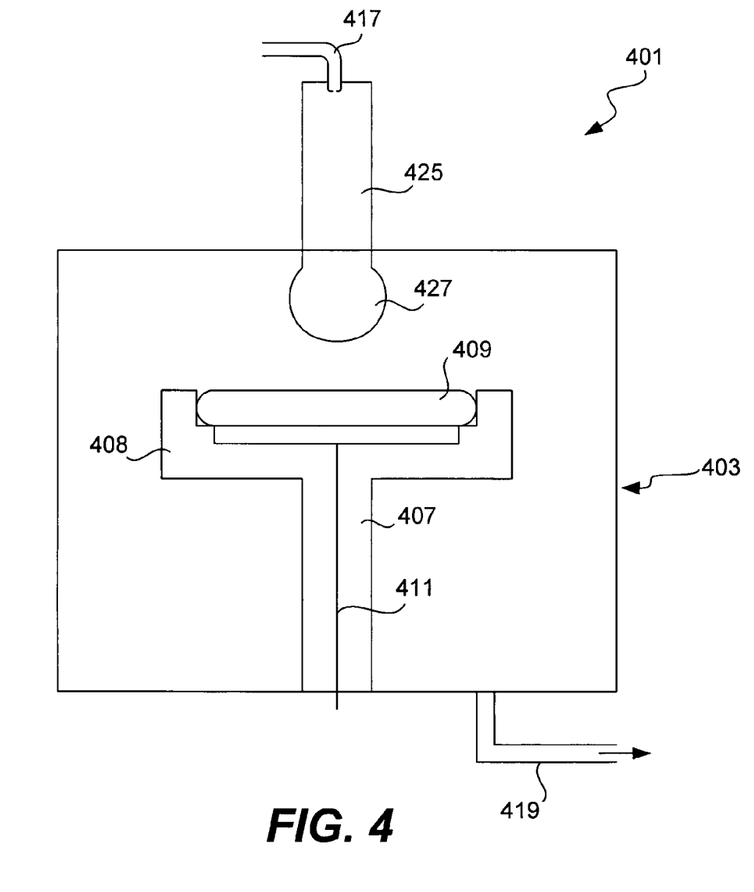
FIG. 4 is a block diagram depicting relevant components of a suitable reactor for performing dielectric deposition using a nanolaminate dielectric deposition process (e.g., PDL or ALD) in accordance with one embodiment of this invention.

FIG. 4 is a block diagram depicting some components of a suitable reactor for performing dielectric deposition using a PDL process and seam healing in accordance with one embodiment of this invention. Note that this apparatus is only an example of suitable apparatus for deposition in accordance with this embodiment of the present invention. Many other apparatuses and systems, including a multi-chambered apparatus, may be used.

As shown, a reactor 401 includes a process chamber 403, which encloses components of the reactor and serves to contain the reactant gases and provide and area to introduce the reactant gases to substrate 409. The chamber walls may be made of or plated with any suitable material, generally a metal that is compatible with the deposition and associated processes conducted therein. In one example, the process chamber walls are made from aluminum. Within the process chamber, a wafer pedestal 407 supports a substrate 409. The pedestal 407 typically includes a chuck 408 to hold the substrate in place during the deposition reaction. The chuck 408 may be an electrostatic chuck, a mechanical chuck or various other types of chuck as are available for use in the industry and/or research.

A heat transfer subsystem including resistive heaters and/or lines 411 for supplying a heat transfer fluid to the pedestal 407 controls the temperature of pedestal 407. In some embodiments, the heat transfer fluid comprises water or another liquid. The reactant gases, as well as inert gases during purge, are introduced individually into the reactor via inlet 417. A showerhead 427 may be used to distribute the gas flow uniformly in the process reactor. Reactant gases are introduced through a gas supply inlet mechanism including orifices. There may be multiple reactant gas tubes and inlets. A vacuum pump connected to outlet 419 can draw out gases between PDL cycles.

Following oxide deposition by PDL, the deposition of the expansion material may be conducted in the same or a different reactor. In the case of polysilicon, deposition is carried out in a thermal CVD reactor, a batch furnace for example. The anneal/oxidation can be carried out in a furnace (thermal anneal by $H_2O/O_2$), an RTP tool, or a laser spike anneal chamber. Suitable apparatus and its operation in accordance with the present invention would be readily apparent to one skilled in the art from the disclosure provided herein.

Various details of the apparatus have been omitted for clarity's sake, and various design alternatives may be implemented.

EXAMPLE

The following example provides details relating to the practice and advantages of a gap fill method in accordance with the present invention. It should be understood the following is representative only, and that the invention is not limited by the detail set forth in this example.

The feasibility of the method for filling gaps in accordance with the present invention was tested. The following gap fill protocol was used as then samples studied as described below:

Gaps smaller than about 75 nm wide with an aspect ratio of greater than 5:1 were partially filled with PDL oxide. PDL gapfill was conducted at 230° C. and 20 Torr, with TPOSL used for silicon oxide precursor, and TMA used to catalyze the reaction of silicon oxide formation, until a gap width of about 200-500 Å, remained unfilled. Polysilicon was deposited in the partially filled gaps by thermal CVD, operating at under 600° C. at subatmospheric pressure with $SiH_4$ as the deposition precursor. All samples were then annealed in steam for 1 hour at a temperature of at least 700° C. The samples were decorated with HF solution for 10 seconds before SEM images were taken. The objective was to expose areas of low density material by etching the material and forming voids in the trenches.

Figure 5A:
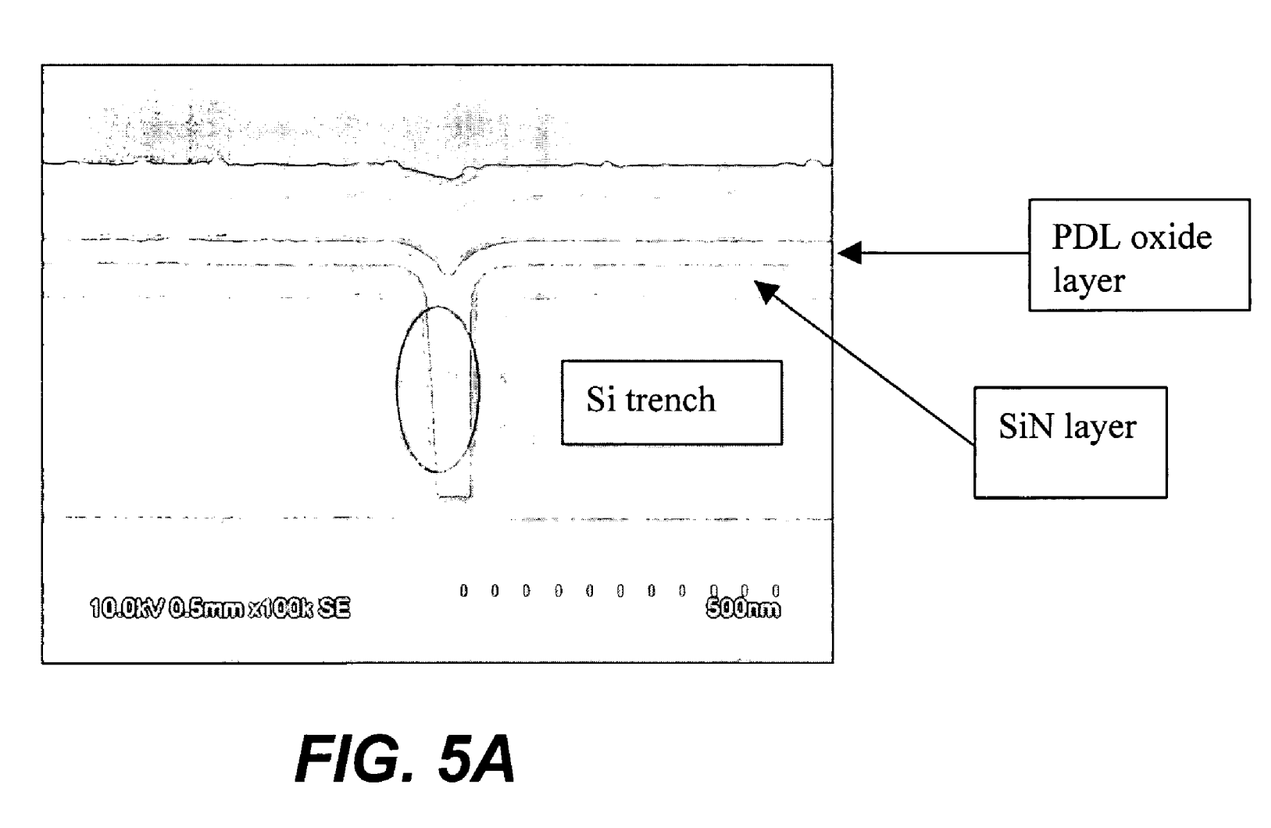
FIGS. 5A-C show cross section structures of a control structure and the gaps filled in accordance with the invention in the described example.
Figure 5B:
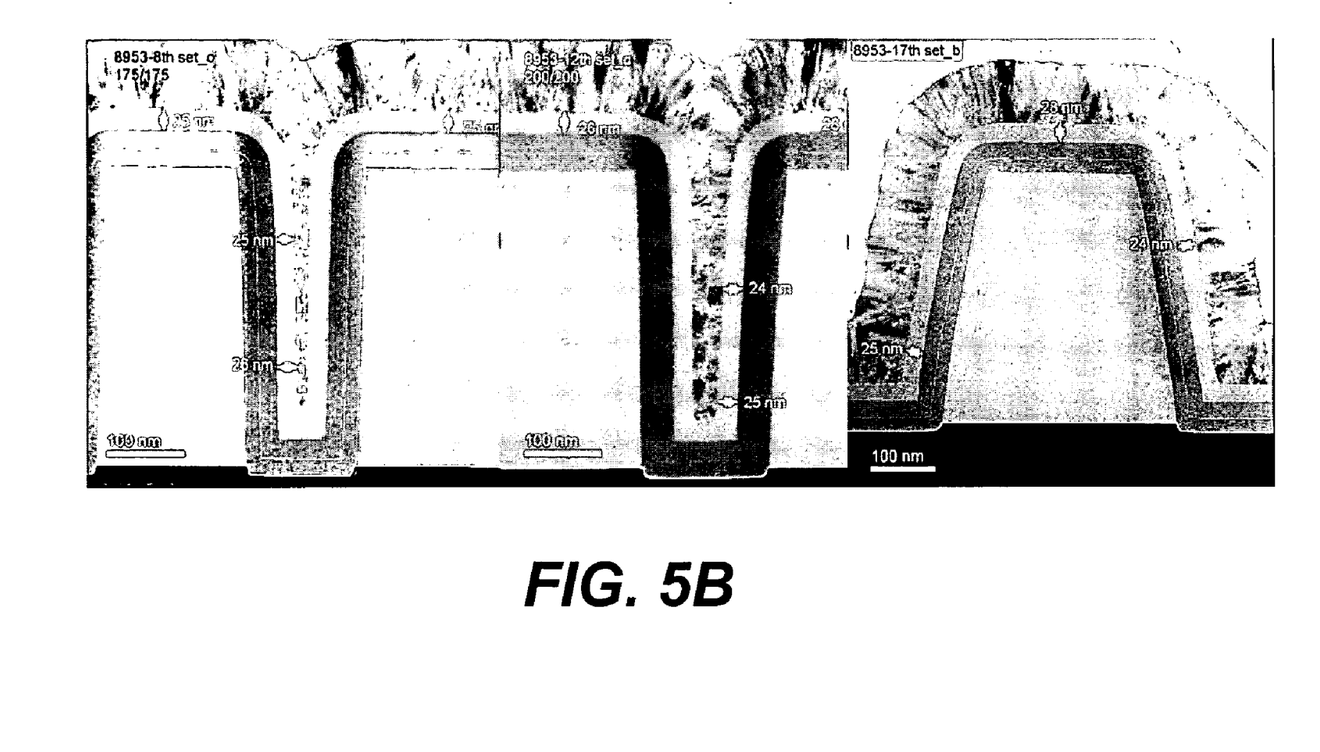
Figure 5C:
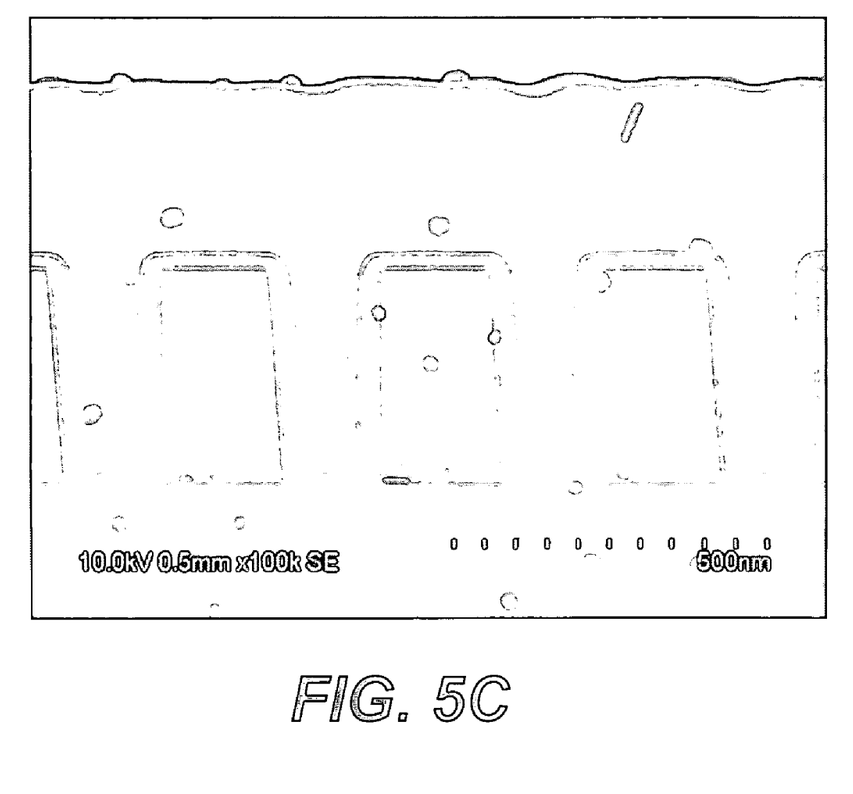

Cross section structures of a control structure and the gaps filled in accordance with the invention before and after oxidation are illustrated in the SEM images of FIGS. 5A-C.

In FIG. 5A the baseline PDL gap fill performance is shown as a control. A seam forms in the gap and expands after HF decoration.

FIG. 5B shows a gap partially filled with PDL oxide after polysilicon deposition in accordance with the invention. The polysilicon can be seen distinctly from the oxide in center of the trench.

FIG. 5C shows the filled gap following anneal of the polysilicon in the trench after HF decoration. The material appears uniform in terms of density and composition, and no decoration gradients are seen.

Figure 6:
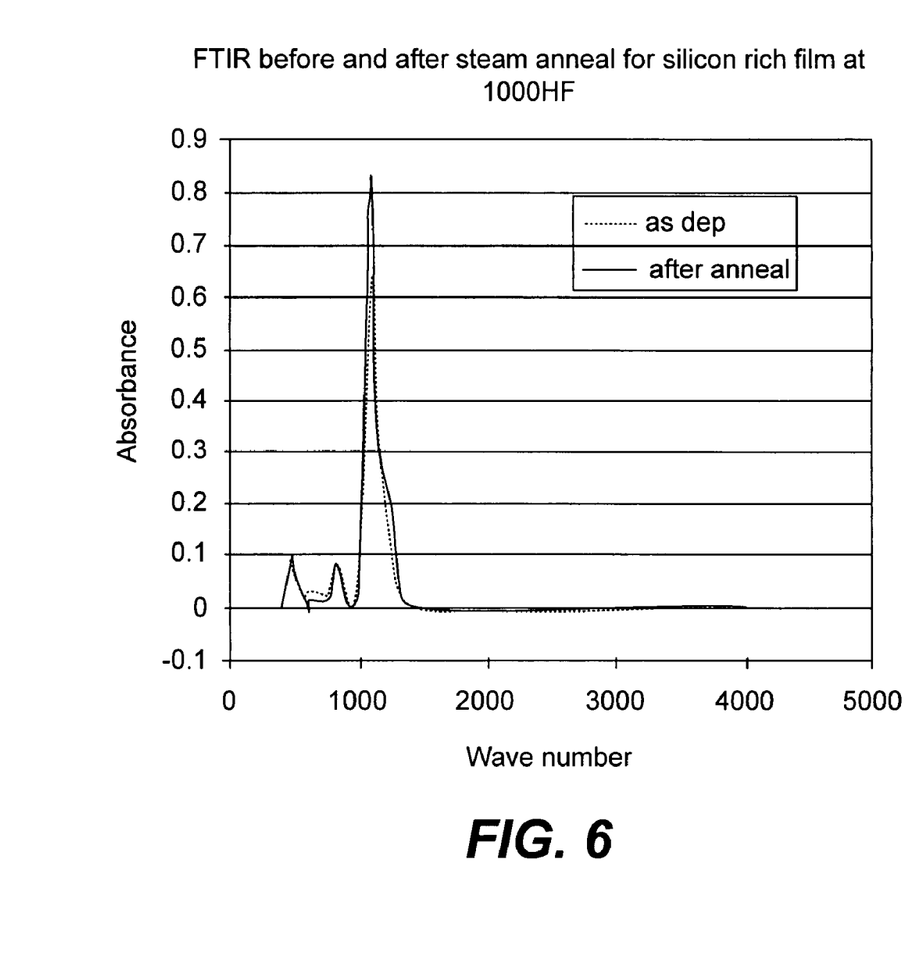
FIG. 6 shows the FTIR spectra of the annealed film of the described example.

FIG. 6 is shows the FTIR spectra of the annealed film. The post anneal spectra do not contain Si—H peaks (at around 2200 $cm^{-1}$), which indicates complete conversion to $SiO_2$.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. For example, while the invention has been described primarily with reference to a PDL embodiment herein, other deposition techniques, such as ALD, can also be used in accordance with the invention. Also, while the invention has been described primarily in terms of preparing integrated circuits, it is not so limited. Accordingly, the present embodiments are to be considered as illustrative and not restrictive, and the invention is not to be limited to the details given herein, but may be modified within the scope and equivalents of the appended claims.

The entire disclosures of all references cited herein are incorporated by reference for all purposes.

The invention claimed is:

1. A method of filling a gap on a semiconductor substrate, the method comprising:
   a) providing in a deposition reaction chamber a semiconductor substrate having a gap on a surface;
   b) conformally depositing a dielectric film on the substrate surface until the gap is partially filled, wherein the dielectric film is deposited until the remaining width of the gap is sufficiently narrow such that reactant diffusion limitations prevent conformal deposition;
   c) depositing in the remaining gap a second material having the capacity to expand and form dielectric when treated following deposition; and
   d) treating the second material following it deposition to cause it to expand and form dielectric;
   whereby the gap is filled with dielectric.

2. The method of claim 1, wherein operation d) is an oxidation.

3. The method of claim 1, wherein the second material comprises silicon.

4. The method of claim 3, wherein operation d) is an oxidation.

5. The method of claim 4, wherein the second material is polysilicon.

6. The method of claim 1, wherein the second material comprises an organosilicon material.

7. The method of claim 1, wherein the dielectric film comprises silicon dioxide.

8. The method of claim 1, wherein the dielectric film is deposited until the gap width is less than 100 Å.

9. The method of claim 1, wherein the dielectric film is deposited until the gap width is about 40 Å.

10. The method of claim 9, wherein the second material comprises silicon.

11. The method of claim 10, wherein operation d) is an oxidation.

12. The method of claim 11, wherein the second material is polysilicon.

13. The method of claim 11, wherein the second material comprises an organosilicon material.

14. The method of claim 10, wherein the oxidation is conducted in steam for 1 hour at a temperature of at least 700° C.

15. The method of claim 1, wherein b) comprises:
   (i) exposing the substrate surface to a catalyst or catalyst-containing precursor gas to form a catalyst or a catalyst-containing precursor on the substrate surface; and
   (ii) exposing the substrate surface to a silicon-containing precursor gas to form a silicon oxide-based dielectric film layer on the substrate.

16. The method of claim 15, wherein the catalyst or catalyst-containing precursor is a metal catalyst-containing precursor is selected from the list of metal catalyst-containing precursors comprising aluminum, zirconium, hafnium, gallium, titanium, niobium, and tantalum.

17. The method of claim 16, wherein the metal catalyst-containing precursor is at least one of hexakis(dimethylamino) aluminum and trimethyl aluminum.

18. The method of claim 15, wherein the catalyst or catalyst-containing precursor is a metal- and metalloid-free catalyst that can sufficiently adsorb onto or react with the substrate surface and prepare it to react with the subsequently added silicon-containing precursor to form a dielectric layer more than a monolayer thick.

19. The method of claim 18, wherein the catalyst is selected from the group consisting of organic acids, anhydrides of organic acids, dialkylphosphates, alkylphosphates, phosphonic acids, phosphinic acids, phosphorus oxides, alkylamines (primary, secondary or tertiary), arylamines, alky/arylboronic acids, sulphonic acids, water, ammonium salts, phosphonitrile compounds, boron triflates, inorganic acids, anhydrides of inorganic acids, and combinations thereof.

20. The method of claim 15, wherein the silicon-containing precursor is at least one of a silanol and a silanediol.

21. A method of forming a composite structure, the method comprising:
   a) providing in a deposition reaction chamber a porous or fibrous substrate;
   b) depositing on the substrate surface a second material having the capacity to expand and form dielectric when treated following deposition; and
   c) treating the second material following its deposition to cause it to expand;
   whereby the composite is formed.

22. The method of claim 21, wherein the second material is a metal or metalloid.

23. The method of claim 21, wherein operation c) is an oxidation.

* * * * *